(12) United States Patent
Krech, Jr. et al.

(10) Patent No.: US 6,973,404 B1
(45) Date of Patent: Dec. 6, 2005

(54) METHOD AND APPARATUS FOR ADMINISTERING INVERSION PROPERTY IN A MEMORY TESTER

(75) Inventors: Alan S Krech, Jr., Fort Collins, CO (US); John M Freeseman, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 1031 days.

(21) Appl. No.: 09/659,198

(22) Filed: Sep. 11, 2000

(51) Int. Cl.[7] ............................................. G11C 29/00
(52) U.S. Cl. .................... 702/117; 702/59; 702/120; 714/718; 365/201
(58) Field of Search .................. 702/117, 120, 57, 702/58, 59, 108, 182, 183, 186; 324/211; 714/718–723, 714/3; 365/201

(56) References Cited

U.S. PATENT DOCUMENTS

| | | | |
|---|---|---|---|
| 4,933,839 A * | 6/1990 | Kinoshita et al. ............... 712/8 |
| 5,185,744 A * | 2/1993 | Arimoto et al. ............. 714/719 |
| 5,604,913 A * | 2/1997 | Koyanagi et al. ............... 712/5 |
| 5,668,819 A * | 9/1997 | Fukushima .................. 714/736 |
| 5,717,701 A * | 2/1998 | Angelotti et al. ............. 714/30 |
| 5,901,155 A * | 5/1999 | Proulx ........................ 714/738 |
| 6,246,971 B1 * | 6/2001 | Kermani et al. ............ 702/119 |
| 6,295,620 B1 * | 9/2001 | Togo .......................... 714/724 |

* cited by examiner

*Primary Examiner*—Marc S. Hoff
*Assistant Examiner*—Jeffrey R West
(74) *Attorney, Agent, or Firm*—June L. Bouscaren

(57) ABSTRACT

A method and apparatus permits use of a tester memory (31) as storage for an inversion mask. The inversion mask indicates to the tester which cells in a DUT memory (14) are logically inverted during testing. Data information and the inverse of the data information is input into a first data multiplexer (802). The stored inversion mask (902–908) is used to independently select a data information bit or its inverse for presentation as a masked output (814) at the output of the first data multiplexer (802).

14 Claims, 3 Drawing Sheets

| ADDR | INVERSION MASK | |
|---|---|---|
| 0-7 | 0x0000 | 902 |
| 8-15 | 0xF00F | 904 |
| 16-23 | 0x0FF0 | 906 |
| 24-31 | 0xFFFF | 908 |

METHOD AND APPARATUS FOR ADMINISTERING INVERSION PROPERTY IN A MEMORY TESTER

BACKGROUND

Electronics devices and capabilities have grown extremely common in daily life. Along with personal computers in the home, many individuals carry more than one productivity tool for various and sundry purposes. Most personal productivity electronic devices include some form of non-volatile memory. Cell phones utilize non-volatile memory in order to store and retain user programmed phone numbers and configurations when the power is turned off. PCMCIA cards utilize non-volatile memory to store and retain information even when the card is removed from its slot in the computer. Many other common electronic devices also benefit from the long-term storage capability of non-volatile memory in un-powered assemblies.

Non-volatile memory manufacturers that sell to the electronic equipment manufacturers require testers to exercise and verify the proper operation of the memories that they produce. Due to the volume of non-volatile memories that are manufactured and sold at consistently low prices, it is very important to minimize the time it takes to test a single part. Purchasers of non-volatile memories require memory manufacturers to provide high shipment yields because of the cost savings associated with the practice of incorporating the memory devices into more expensive assemblies with minimal or no testing. Accordingly, the memory testing process must be sufficiently efficient to identify a large percentage of non-conforming parts and preferably all non-conforming parts in a single test process.

As non-volatile memories become larger, denser and more complex, the testers must be able to handle the increased size and complexity without significantly increasing the time it takes to test them. As memories evolve and improve, the tester must be able to easily accommodate the changes made to the device. Another issue specific to testing non-volatile memories is that repeated writes to cells of the memories can degrade the overall lifetime performance of the part. Non-volatile memory manufacturers have responded to many of the testing issues by building special test modes into the memory devices. These test modes are not used at all by the purchaser of the memory, but may be accessed by the manufacturer to test all or significant portions of the memories in as little time as possible and as efficiently as possible. Some non-volatile memories are also capable of being repaired during the test process. The tester, therefore, should be able to identify: a need for repair; a location of the repair; the type of repair needed; and, must then be able to perform the appropriate repair. Such a repair process requires a tester that is able to detect and isolate a specific nonconforming portion of the memory. In order to take full advantage of the special test modes as well as the repair functions, it is beneficial for a tester to be able to execute a test program that supports conditional branching based upon an expected response from the device.

From a conceptual perspective, the process of testing memories is an algorithmic process. As an example, typical tests include sequentially incrementing or decrementing memory addresses while writing 0's and 1's into the memory cells. It is customary to refer to a collection of 1's and 0's being written or read during a memory cycle as a "vector", while the term "pattern" refers to a sequence of vectors. It is conventional for tests to include writing patterns into the memory space such as checkerboards, walking 1's and butterfly patterns. A test developer can more easily and efficiently generate a program to create these patterns with the aid of algorithmic constructs. A test pattern that is algorithmically coherent is also easier to debug and use logical methods to isolate portions of the pattern that do not perform as expected. A test pattern that is generated algorithmically using instructions and commands that are repeated in programming loops consume less space in tester memory. Accordingly, it is desirable to have algorithmic test pattern generation capability in a memory tester.

Precise signal edge placement and detection is also a consideration in the effectiveness of a non-volatile tester. In order to capture parts that are generally conforming at a median while not conforming within the specified margins, a non-volatile memory tester must be able to precisely place each signal edge relative in time to another signal edge. It is also important to be able to precisely measure at which point in time a signal edge is received. Accordingly, a non-volatile memory tester should have sufficient flexibility and control of the timing and placement of stimuli and responses from the Device Under Test (memory).

Memory testers are said to generate transmit vectors that are applied (stimulus) to the DUT, and receive vectors that are expected in return (response). The algorithmic logic that generates these vectors can generally do so without troubling itself about how a particular bit in a vector is to get to or from a particular signal pad in the DUT. At this level it is almost as if it were a certainty that adjacent bits in the vector would end up as physically adjacent signals on the DUT. Life should be so kind!

In reality, the correspondence between bits in a vector at the "conceptual level" and the actual signals in the DUT is apt to be rather arbitrary. If nothing were done to prevent it, it might be necessary to cross one or more probe wires as they descend from a periphery to make contact with the DUT. Such crossing is most undesirable, and it is convention to incorporate a mapping mechanism in the path of the transmit vector to rearrange the bit positions in the transmit vector before they are applied to the DUT, so that task of making physical contact is not burdened with crossings. Receive vectors are correspondingly applied to a reverse mapping mechanism before being considered. In this way the algorithmic vector generation and comparison mechanisms can be allowed to ignore this entire issue. As another example of what such mappers and reverse mappers can do, consider the case when a different instance of the same type of DUT is laid out on the same wafer, but with a rotation or some mirrored symmetry, in order to avoid wasting space on the wafer. These practices also have an effect on the correspondence between vector bit position and physical signal location, but which can be concealed by the appropriate mappings and reverse mappings. It will be appreciated that the mappings and reverse mappings needed for these situations are, once identified for a particular DUT, static, and need not change during the course of testing for that particular DUT.

There are certain types of memories that store information in one part of the device in one format and store information in another part of the device in an inverted format. Sometimes, inversion properties exist for each memory cell and are often unique to subsets of the DUT memory. Keeping track of the inversion properties when developing and debugging test code is a laborious process that is prone to error. Additionally, the inversion properties are typically dependent upon addresses. A test developer that attempts to write a test pattern that also administers the inversion properties finds that the inversion properties cause a loss of an algorithmic aspect of test code. Without the algorithmic aspect as an aid in developing test patterns, the overall test code can be significantly larger than a similar sized block of memory without inversion properties. There is a need, therefore, to provide a simple solution to obviate the need for the test developer to keep track of and administer the inversion properties when developing the test code and to maintain an algorithmic aspect of a test pattern.

SUMMARY

According to another aspect of the invention, a method for administering inversion properties on data channels in a DUT tester comprises the steps of storing an inversion mask in a tester memory, selectively inverting data information according to the inversion mask to generate a masked output, and applying the masked output to the data channels.

Advantageously, a tester according to the teachings of the present invention offers additional flexibility and efficiency in developing test patterns compared to prior art testers.

DETAILED DESCRIPTION

Figure 1:
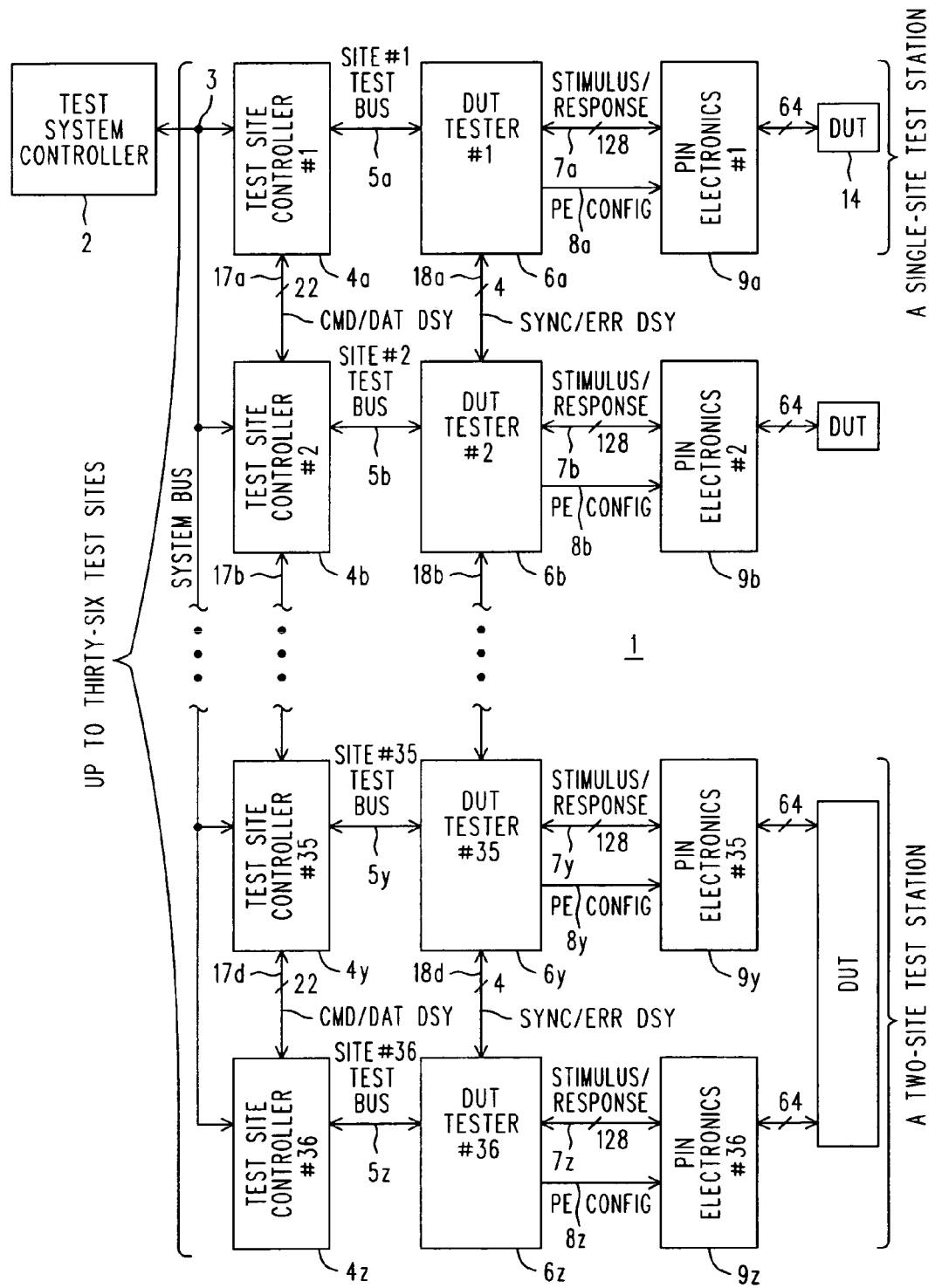
FIG. 1 is a simplified block diagram of an extensively reconfigurable non-volatile memory tester constructed in accordance with the invention.

Refer now to FIG. 1, wherein is shown a simplified block diagram 1 of a Non-Volatile Memory Test System constructed in accordance with the principles of the invention. In particular, the system shown can simultaneously test, with as many as sixty-four test points each, up to thirty-six individual DUT's (Devices Under Test) at one time, with provisions for reconfiguration to allow elements of a collection of test resources to be bonded together to test DUT's having more than sixty-four test points. These test points may be locations on a portion of an integrated circuit wafer that has not yet been diced and packaged, or they might be the pins of a packaged part. The term "test point" refers to an electrical location where a signal may be applied (e.g., power supplies, clocks, data inputs) or where a signal can be measured (e.g., a data output). We shall follow the industry custom of referring to the test points as "channels". The "collection of test resources to be bonded together" referred to above may be understood as being as many as thirty-six test sites, where each test site includes a Test Site Controller (4), a (sixty-four channel) DUT Tester (6) and a (sixty-four channel) collection of Pin Electronics (9) that makes actual electrical connection to a DUT (14). In the case where testing the DUT requires sixty-four or fewer channels, a single Test Site is sufficient to perform tests upon that DUT, and we say, for example, that the Test Site #1 (as it appears in FIG. 1) forms or operates as a "Single Site Test Station". On the other hand, when some form of the aforementioned reconfiguration is in effect, two (or more) Test Sites are "bonded" together to function as one larger equivalent Test Site having one hundred and twenty-eight channels. Accordingly, and again in reference to an example shown in FIG. 1, we say that Test Sites #35 and #36 form a "two-Site Test Station".

To briefly consider the opposite case, one should not assume that an entire Test Site is needed to test a single DUT, or that a single Test Site can test but a single DUT. Suppose that a wafer had two (probably, but not necessarily, adjacent) dies, the sum of whose test channel requirements were sixty-four channels or less. Both DUT's can be tested by a single Test Site. What makes this possible is the general purpose programmability of each Test Site. A test program executed by the Test Site may be written such that one part of the Test Site's resources is used to test one of the DUT's while another part is used to test the other DUT. After all, we would assume that if we had a third DUT that were the logical union of the first two, then we would be able to test that third DUT with a single Test Site, so we ought to be able to similarly test its "component DUT's", as it were. The only difference is individually keeping track of whether the two "component DUT's" pass or fail, as opposed to a unified answer for the "third" DUT (that is, there is an issue concerning what portion of the "third" DUT failed). This "Single-Site Multi-Test Station" capability is largely conventional, and we mention it here for the sake of completeness, and to ward off potential confusion and misunderstanding when comparing it to the notion of bonding two or more Test Sites together.

Were it not for this notion of reconfiguration there would be no difference between a Test Site and a Test Station, and we would dispense with one of the terms. As it is, however, it will be readily appreciated that the number of Test Stations need not equal the number of Test Sites. In the past, the numbers could be different because Test Sites were split to create more Test Stations (DUT's not complex enough to consume an entire Test Site). Now, however, the difference may also be due to Test Sites having been bonded together to form multi-site Test Stations (DUT's too complex for a single Test Site).

To continue, then, a Test System Controller 2 is connected by a System Bus 3 to as many as thirty-six Test Site Controllers whose names end in the suffixes #1 through #36 (4a–4z). (It is true that subscripts a–z only go from one to twenty-six, and not to thirty-six. But this minor deception seems preferable over numerical subscripts on numerical reference characters, which would be potentially very confusing.) The Test System Controller 2 is a computer (e.g., a PC running NT) executing a suitable Test System Control Program pertaining to the task of testing non-volatile memories. The Test System Control Program represents the highest level of abstraction in a hierarchical division of labor (and of complexity) for accomplishing the desired testing. The Test System Controller determines which programs are being run by the different Test Sites, as well as overseeing a robotics system (not shown) that moves the test probes and DUT's as needed. Test System Controller 2 may function in ways that support the notion that some Test Sites are programmed to perform as single-site Test Stations, while others are bonded together to form multi-site Test Stations. Clearly, in such circumstances there are different parts being tested, and it is most desirable that different tests be used for the different parts. Likewise, there is no requirement that all single-site Test Stations be testing the same style of part, nor is there any such requirement for multi-site Test Stations. Accordingly, the Test System Controller 2 is programmed to issue the commands to accomplish the needed Test Site bonding and then to invoke the appropriate test programs for the various Test Stations in use. The Test System Controller 2 also receives information about results obtained from the tests, so that it may take the appropriate action for discarding the bad part and so that it may maintain logs for the various analyses that may be used to control, say, production processes in a factory setting.

The Test System itself is a fairly large and complex system, and it is common for it to use a robotics subsystem to load wafers onto a stage that then sequentially positions one or more future dies under probes connected to the Pin Electronics 9, whereupon those future dies (the wafer has not yet been diced) are tested. The Test System can also be used to test packaged parts that have been loaded onto a suitable carrier. There will be (as is explained below), at least one Test Site Controller associated with each Test Station in use, regardless of how many Test Sites are used to form that Test Station, or of how many Test Stations are on a Test Site. A Test Site Controller is an embedded system that may be an i960 processor from Intel with thirty-six to sixty-four MB of combined program and data memory running a proprietary operating system called VOS (VersaTest O/S), which was also used in earlier products for testing non-volatile memories (e.g., the Agilent V1300 or V3300). For the moment, we shall consider only the situation for single-site Test Stations. For the sake of a definite example, suppose that Test Site #1 is functioning as Test Station #1, and that it is to test the WHIZCO part no. 0013. The test regimen involves a hundred or so different types of tests (varying and monitoring voltage levels, pulse widths, edge positions, delays, as well as a large dose of simply storing and then retrieving selected patterns of information), and each type of test involves many millions of individual memory cycles for the DUT. At the highest level, the operators of the Test System instruct the Test System Controller 2 to use Test Station #1 to begin testing WHIZCO 0013's. In due course the Test System Controller 2 tells Test Site Controller #1 (4a) (which is an embedded [computer] system) to run the associated test program, say, TEST_WHIZ_13. If that program is already available within Test Site Controller #1's environment, then it is simply executed. If not, then it is supplied by the Test System Controller 2.

Now, in principle, the program TEST_WHIZ_13 could be entirely self-contained. But if it were, then it would almost certainly be rather large, and it may be difficult for the processor of the embedded system within the Test Site Controller 4a to run fast enough to produce the tests at the desired speed, or even at a rate that is uniform from one DUT memory cycle to the next. Accordingly, low level subroutine type activities that generate sequences of address and associated data that is to be written or is expected from a read operation, are generated as needed by a programmable algorithmic mechanism located in the DUT Tester 6, but that operates in synchrony with the program being executed by the embedded system in the Test Site Controller 4. Think of this as exporting certain low level subroutine-like activity and the task of initiating DUT memory cycles out to a mechanism (the DUT Tester) that is closer to the hardware environment of the DUT 14. Generally speaking, then, whenever the Test System Controller 2 equips a Test Site Controller with a test program it also supplies the associated DUT Tester with appropriate low level implementation routines (perhaps specific to the memory being tested) needed to accomplish the overall activity described or needed by the programming for the Test Site Controller. The low level implementation routines are termed "patterns", and they are generally named (just as functions and variables in high level programming languages have names).

Each Test Site Controller #n (4) is coupled to its associated DUT Tester #n (6) by a Site Test Bus #n (5). The Test Site Controller uses the Site Test Bus 5 to both control the operation of the DUT Tester and receive therefrom information about test outcomes. The DUT Tester is capable of generating at high speed the various DUT memory cycles that are involved in the test regimen, and it decides if the results of a Read memory cycle are as expected. In essence, it responds to commands or operation codes ("named patterns") sent from the Test Site Controller by initiating corresponding useful sequences of Read and Write DUT memory cycles (i.e., it executes the corresponding patterns). Conceptually, the output of the DUT Tester 6 is stimulus information that is to be applied to the DUT, and it also accepts response information therefrom. This stimulus/response information 7a passes between the DUT Tester 6a and a Pin Electronics #1 assembly 9a. The Pin Electronics assembly 9a supports up to sixty-four probes that can be applied to the DUT 14.

The above-mentioned stimulus information is just a sequence of parallel bit patterns (i.e., a sequence of "transmit vectors" and expected "receive vectors") expressed according to the voltage levels of some family of logic devices used in the DUT Tester. There is a configurable mapping between bit positions within a stimulus/response and the probes on the die, and this mapping is understood by the DUT Tester 6. The individual bits are correct as to their timing and edge placement, but in addition to the mapping they may also need voltage level shifting before they can be applied to the DUT. Likewise, a response that originates in the DUT subsequent to a stimulus may need buffering and (reverse) level shifting before it can be considered suitable for being fed back to the DUT Tester. These level shifting tasks are the province of the Pin Electronics 9a. The Pin Electronics configuration needed for testing a WHIZCO 0013 likely will not work for testing a part from the ACME Co., and perhaps not even with another WHIZ Co. part. So, it will be appreciated that the Pin Electronics assembly needs to be configurable also; such configurability is the function of the PE Config lines 8a.

The above concludes a brief architectural overview of how a single Test Site is structured for testing a DUT. We turn now to issues that arise when there are many Test Sites with which to operate. As a preliminary, we shall describe a preferred embodiment for constructing a Test System having multiple Test Sites. In many respects, some of the information we are about to describe are matters of choice based on market studies of customer preference and cost benefit analyses. Be that as it may, to build one of these things one has to make definite choices, and once that is done there are particular consequences that are visible throughout the entire system. It is felt that it is useful to describe, at least in a general way, the larger outlines of the hardware properties of the Test System. Even though some of these properties are contingent, a knowledge of them will nevertheless assist in an appreciation of various examples used to illustrate the invention.

To begin, then, consider four rather large card cages. Each card cage has, besides power supplies and water cooling (fans can be a source of contamination in a clean room environment), a mother board, a front plane and a back plane. Into each card cage can be placed up to nine assemblies. Each assembly includes a Test Site Controller, DUT Tester and Pin Electronics. We shall be describing the general outlines of how Test Site Controllers are bonded together, which will involve some busses used to create daisy chains.

A brief digression concerning the term "daisy chain" is perhaps in order. Consider system elements A, B, C and D. Suppose that they are to be daisy chained together in that order. We could say that there is an information or control path that leaves A and goes into B, that B can selectively pass on traffic that then leaves B and goes into C, and that C can selectively pass on traffic that then goes into D. These same kind of arrangements can exist for traffic in the other direction, too. Daisy chains are often used to create priority schemes; we shall use them to create master/slave relationships between various the Test Site Controllers. We shall denote these daisy chained style communication arrangements with the suffix noun "DSY", instead of "BUS". Thus, we might refer to a Command/Data DSY instead of a Command/Data Bus. Now, the notion that information "enters B and is selectively passed on" may suggest that traffic is replicated onto a separate set of conductors before being passed on. It could be that way, but for performance reasons it is more like a regular bus having addressable entities. By means of a programmable address mapping arrangement and the ability to put portions of downstream Test Site Controllers "to sleep," the single bus can be made to logically appear (i.e., to function) as a plurality of daisy chains. Finally, it will be appreciated that the daisy chains are high performance pathways for command and control information, and that if they were not, then we could not expect a master/slave combination (multi-site Test Station) to operate as fast as a single Test Site does. For the benefit of daisy chain performance, the various DSY do not leave their respective card cages. The effect of this decision is to place some limits on which Test Sites (and thus also how many) can be bonded together. In principle, there is no fundamental need for this limitation, nor is there a genuine lack of technical practicality involved (it could be done); it is simply felt that, since there are already nine Test Sites in a card cage, extending the DSY's adds significant cost for relatively little additional benefit.

To resume our discussion of FIG. 1, then, consider the various Test Site Controllers 4a–4z that can populate the four card cages, each with nine Test Site Controllers. Let's denote them as 4a–4f, 4g–4m, 4n–4t and 4u–4z. (Never minding, as explained earlier, that these are nominally only twenty-six subscripts--the reader is invited to imagine that there are another ten subscript symbols in there, someplace.) A CMD/DAT DSY 17a (Command & Data Daisy Chain) interconnects the Test Site Controller 4a–4f that are in one card cage, while a different CMD/DAT DSY 17b interconnects the Test Site Controllers 4g–4m in another card cage. The same arrangement exists for the remaining card cages, and Test Site Controllers 4n–4t and 4u–4z, respectively. We have earlier said that the DSY do not leave the card cages, in that "tail end" of a bus that actually forms the DSY does not leave a card cage and become the head of the next segment in another card cage. Instead, the System Bus 3 from the Test System Controller 2 goes to all Test Site Controllers, and each is capable of becoming a Master at the head of a DSY segment that does not leave the card cage.

The CMD/DAT DSY 17a–d that we have been discussing exist between the various Test Site Controllers 4a–4z. There is a similar arrangement for the SYNC/ERR DSY 18a–18d and the DUT Testers 6a–6z. The synchronization and error information conveyed by the SYNC/ERR DSY 18 allows DUT Testers to function in unison. These two daisy chains (17 and 18) carry slightly different types of information, but each exists as part of the same general mechanism for bonding one or more Test Sites together into a Test Station.

Figure 2:
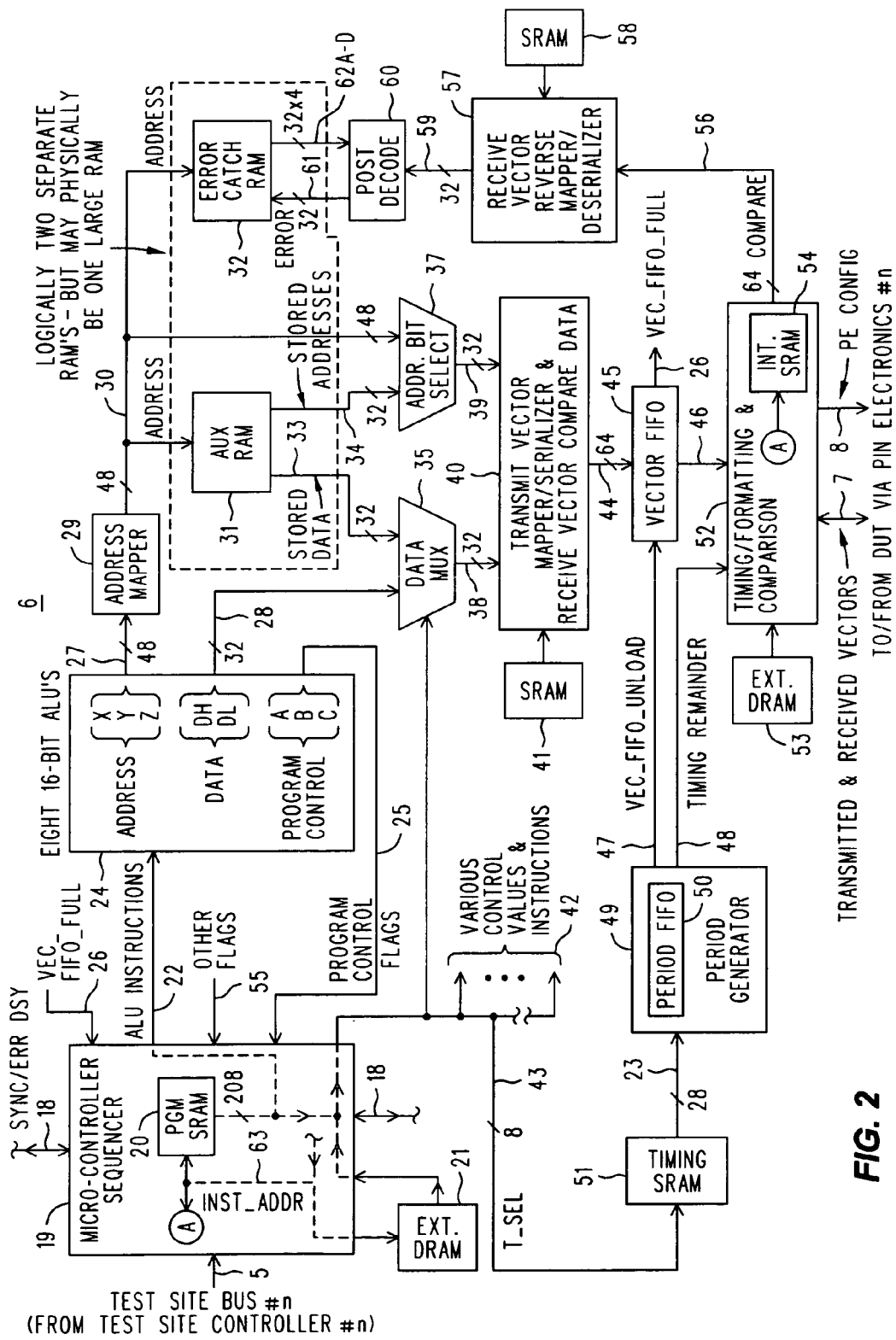
FIG. 2 is a simplified block diagram expansion of the DUT tester 6 of FIG. 1.

We turn now to a discussion of FIG. 2, which is a simplified block diagram expansion of the DUT tester 6 of FIG. 1, of which there may be as many as thirty-six. It is sufficient at present to describe only one instance thereof. A glance at FIG. 2 will show that it is a fairly well populated with stuff; especially so for a "simplified" block diagram. Some of what is in the DUT Tester 6 and represented in the block diagram is functionally quite complicated, and is not available in "off the shelf" form. It is appropriate here to make two points. First, the primary purpose of including FIG. 2 is to describe the basic properties of an important operational environment within the overall Non-Volatile Memory Test System 1. The invention(s) that are fully described in connection with FIG. 3 and subsequent figures will either be expansions of mechanisms set out in the following description of FIG. 2, or they will be new mechanisms whose motivational premise is found in FIG. 2. Either way, as this is written it is not known exactly which of these is before the reader. The goal at present is to provide a simplified yet informative starting point for numerous different Detailed Descriptions of various Preferred Embodiments, so that each of those can be as concise as is appropriate (as opposed to one "jumbo" Specification that discloses everything about each different invention). The second point is that the expanded or extended material, while in general overall agreement with FIG. 2, may contain information that does not "match-up" exactly with the simplified version. This does not mean there has been an error, or that things are fatally inconsistent; it arises because it is sometimes difficult or impossible to simplify something such that it is the exact image in miniature. The situation is rather like maps. A standard size road map of Colorado will show that when going east on I-70 you can go north on I-25 at Denver. It looks like a left turn. And while it did used to be an actual left turn, it isn't one now, and a detailed map of that intersection will show a sequence of component turns and intervening road sections. But no one would say that the standard size road map is wrong; it is correct for its level of abstraction. Similarly, and despite its fairly busy appearance, FIG. 2 is indeed a simplification operating at a medium level of abstraction, but some seeming left turns are not simple left turns at all.

As is shown in FIG. 1, the major input to the DUT Tester 6 is an instance of the Test Site Bus 5, which originates from a Test Site Controller 4 that is associated with the instance of the DUT Tester 6 that is of interest. The Test Site Bus 5 is coupled to a Micro-Controller Sequencer 19, which may be likened to a special purpose microprocessor. It fetches instructions from a program stored in a program memory, which may be either internal to the Micro-Controller Sequencer 6 (PGM SRAM 20) or external thereto (EXT. DRAM 21). Although these two memories appear to be addressed by what is essentially a logically common address 63 that serves as a program counter (or, instruction fetch address), and either can be a source of programming to be executed, note that: (1) Only one of the memories performs instruction fetch memory cycles during any period of time; and (2) In fact they are addressed by electrically different signals. The SRAM is fast and allows genuine random access, but consumes valuable space within the Micro-Sequence Controller 19 (which is a large IC), so its size is limited. The external DRAM can be provided in adjustable amounts of considerable quantity, but is fast only when accessed in sequential chunks involving linear execution and no branching. Programming in the SRAM 20 most often that which is intensely algorithmic, while the EXT. DRAM 21 is best suited for material not readily generated by algorithmic processes, such as initialization routines and random or irregular data.

The instruction word executed by the Micro-Controller Sequencer 19 is fairly wide: two hundred and eight bits. It consists of thirteen sixteen-bit fields. These fields often represent fetched instruction information for mechanisms that are outside the Micro-Controller Sequencer proper. Such fields are dedicated to their associated mechanisms. One set of ALU INSTRUCTIONS 22 are applied to a collection of eight sixteen-bit ALU's 24, while others are disbursed to various other mechanisms distributed throughout the DUT Tester. This latter situation is represented by the lines and legend "VARIOUS CONTROL VALUES & INSTRUCTIONS" 42.

The eight sixteen-bit ALU's (24) each have a conventional repertoire of arithmetic instructions built around associated sixteen-bit result registers (each ALU has several other registers, too). Three of these result registers and their associated ALU's are for generating X, Y and Z address components 27 that are variously combined into a complete address to supplied to the DUT. Two more of the eight ALU/registers (DH & DL) are provided to assist in the algorithmic creation of thirty-two bit data patterns 28 that are divided between a most significant portion (DH) and a least significant portion (DL). A final three ALU/registers (A, B, C) are used as counters and contribute to the production of various PROGRAM CONTROL FLAGS 25 that assist with program control and branching on completion of some programmatically specified number of iterations or other numerical condition. These PROGRAM CONTROL FLAGS 25 are sent back to the Micro-Controller Sequencer 19, where they affect the value of the instruction fetch address in ways familiar to those who understand about microprocessors. There are also various OTHER FLAGS 55 that also can be used to effect program branching. These originate with various ones of the other mechanisms within the DUT Tester 6 that are controlled by the different fields of the fetched instruction word. One specific additional flag is expressly shown as a separate item: VEC_FIFO_FULL 26. In another drawing having somewhat less detail it might be lumped in along with the OTHER FLAGS 55. We have separated it out to assist in explaining one aspect of the operation of the Micro-Controller Sequencer 19.

What VEC_FIFO_FULL does is to (temporarily) halt further program execution by the Micro-Controller Sequencer 19. There are many stages of pipeline between the instructions fetched by the Micro-Controller Sequencer 19 and the mechanism that finally hands test vectors off to be applied to the DUT. In addition, part of the baggage that accompanies a vector as it moves toward being applied to the DUT is information concerning the rate of eventual vector application, or, each vector's duration. Thus, the rate of vector application to the DUT need not be constant, and in particular, a group of vectors may take longer to apply than they did to generate. The Micro-Controller Sequencer simply executes programming at its maximum rate. But clearly, on average, the rate of "vector consumption," as it were, must equal the rate of "vector production," lest the pipeline need to be elastic nearly without limit. There is a Vector FIFO 45 at the output of the Address Mapper 29 discussed below, and it serves as an elastic capacity in the pipeline. The signal VEC_FIFO_FULL is used to prevent overrunning the limited number of stages in the pipeline, by causing a temporary cessation in the production of new vectors at the head end of the pipe.

To continue, the (three times sixteen equals forty-eight bits of) X, Y and Z address components 27 are applied to an Address Mapper 29, whose output is a selected-in-advance nearly arbitrary rearrangement of the address values in the ordered forty-eight bit address space. As a point of departure for appreciating this, suppose for a moment that the Address Mapper 29 were a memory that fully populated a forty-eight bit address space, and that it held a forty-eight bit value at each address. (Temporarily never mind that such a memory would—today anyway—be size of a large refrigerator.) Given such a memory, a look-up table could be implemented that could map any applied address into another, arbitrarily selected, forty-eight bit value which could then be used as a replacement address. The reason that such address mapping is desirable is that the X, Y and Z address components generally have useful meaning in the context of a particular DUT's internal architecture, which is most likely not implemented with one big linear decoder. The notions of rows, columns and layers, block or pages may be very useful to the Test Engineer, and failures that occur in locations that are physically close together may involve corresponding closeness in their X, Y and Z addresses. Such patterns in the test results can be valuable in appreciating what is wrong and in trying to fix it, whether at a design level or at a production level of reprogramming a part to shunt a defective section's operation with that of a spare section. Two issues arise from such thinking. The first is paring the forty-eight bits down to the actual number of bits (say, thirty-two, or perhaps sixteen) to be applied to the DUT. We shall shortly briefly mention how the paring down is done, and it is largely a matter of taking this many bits from X, that many from Y and the rest from Z. But not entirely, and this is the second issue, because certain addresses might lie within circuitry that is a left-for-right (or left-for-right and top-for bottom) mirror image of another section of circuitry. This has the effect of rearranging what the bits mean, as far as what sequential address values are in physical order within that circuitry. This chip layout property may occur many times, and it may well be the case that how one group of bits for, say, Y, are interpreted, may depend upon the accompanying value of some other, say, Z bits. The address mapper 29 is provided to allow the raw X, Y and Z addresses to be "repackaged," as it were, to reflect this sort of thing for the benefit of those who would test memories having such internal architectural arrangements. As to how its actually done, the Address Mapper 29 is constructed of a fairly large number of interconnected multiplexers. It cannot implement the completely arbitrary look-up table behavior of a fully populated memory decode scheme as was temporarily assumed above for purposes of explanation. It can however, rearrange sub-fields of the X, Y and Z address components as needed, particularly since there is yet another mechanism that will do the paring down from forty-eight bits to the actual number needed. The Address Mapper 29 also contains three sixteen bit (address) look-up tables that allow it to perform limited arbitrary mapping within local ranges.

The mapped address output 30 of the Address Mapper 29 is applied as an address to an Aux RAM 31 and to an Error Catch RAM 32, which, while having separate functions, may nevertheless be implemented selectable partitions in one larger overall RAM. The mapped address output 30 is also applied as one input to an Addr. Bit Select circuit 37, which is described below.

Consider the Aux RAM 31. Its function is to retain data patterns 33 and addresses 34 that can be applied to the DUT. These are logically separate outputs from the Aux RAM 31, since they are treated somewhat differently and used in different places. (The AUX RAM 31 is not a dual "port memory", but is preferably of several banks whose outputs are applied to MUX's.) In keeping with this, it may be that Stored Data 33 is kept in one bank or range of addresses of the Aux RAM 31, while Stored Addresses 34 are kept in another. Also, we have not shown an explicit mechanism for writing to the Aux RAM 31. That is accomplished by an addressed bus operation initiated by a Test Site Controller 4 at the behest of the program it is executing. (There is an "under the floorboards," as it were, "utility services" bus called the "Ring Bus" [not shown—as it would clutter the drawing immensely] that goes to just about everything in FIG. 2.) The Error Catch RAM 32 is addressed by the same address that is applied to the Aux RAM 31, and it either stores or retrieves information about errors, which operations are performed in conjunction with a Post Decode Circuit, to be discussed later. As with the paths 33 and 34 from the Aux RAM 31, paths 61 (into the Error Catch RAM) and 62 (from the Error Catch RAM) are preferably MUX'ed outputs from a multi-bank memory (the Error Catch RAM 32), in accordance with configuration information distributed by the Ring Bus (not shown).

Note that the Data MUX 35 has as inputs the STORED DATA output 33 from the Aux RAM 31 as well as data 28 from the registers DH and DL in the collection 24 of ALU's. The Data MUX 35 selects which of these inputs (28, 32) to present as its output 38, which is then applied as one of two vector components to a Transmit Vector Mapper/Serializer/ Receive Vector Compare Data Circuit 40 (the other component is the output 39 of the Addr. Bit Select circuit 37). Circuit 40 can perform three functions: assemble vector components (38, 39) into an ordered logical representation an entire vector that is to be applied (transmitted) to the DUT; apply an arbitrary dynamic correspondence (mapping) between the ordered bits of the logical representation of the transmit vector and the actual physical channel number of the Pin Electronics (i.e., which probe tip) will contact the DUT on behalf of that signal (i.e., that bit in the vector); and, cooperate with the compiler in the division of an entire logical vector into pieces to be applied separately and in order (serialization) for DUT's that admit of such a thing. Which of these functions is performed is determined by control signals from an SRAM 41, which is also addressed in accordance with a field in the two hundred and eight bit instruction fetched by the Micro-Controller Sequencer 19. The output of Circuit 40 is an up to sixty-four bit vector 44 that is applied to a Vector FIFO 45, which when full generates the signal VEC_FIFO_FULL 26, whose meaning and use was discussed above. The vector at the top of the Vector FIFO 45 is removed therefrom upon receipt of a signal VEC_FIFO_UNLOAD 47 that originates at a Period Generator 49 (to be discussed shortly). Such removed vectors (46) are applied to a Timing/Formatting & Comparison circuit 52 that is connected to the DUT via the associated instance of Pin Electronics 9. That is, each instance of Pin Electronics 9 receives Transmitted & Received Vectors 7 and Pin Electronics configuration information 8 from its associated Timing/Formatting & Comparison circuit 52.

The Timing/Formatting & Comparison circuit 52 has an Internal SRAM 54 addressed by the same Instruction Address ("A" in the small circle) as is the Program SRAM 20 of the Micro-Controller Sequencer 19. (An External DRAM 53 may be used in place of the Internal SRAM 54.) The Internal SRAM 54 (or external DRAM 53) assists in the production of Drive and Comparison cycles. Drive cycles apply a transmit vector to the DUT. Comparison cycles receive a vector presented by the DUT and examine it to determine if it matches previously supplied comparison data. Both Drive and Comparison cycles are adjustable as to their duration, whether and when a load is applied, and when data is latched or strobed. The comparison produces a sixty-four bit value 56 that is applied to a Receive Vector Reverse Mapper/Deserializer 57, whose function may be considered to be the logical inverse of circuit 40. (The operation of circuit 57 is controlled by an SRAM 58 that corresponds to the control of circuit 40 by SRAM 41.) In turn, the output 59 of circuit 57 is applied to the Post Decode circuit 60. At present, it is sufficient to say that the Post Decode circuit 60 can inspect via programmatic criteria both incoming error information 59 and (previously) stored error information 60 (stored in Error Catch RAM) to produce condensed and more readily interpretable error information which may then by stored back into the Error Catch RAM 32 via path 61. An example would be to create a count of how many times there was an error within a particular range of addresses, which information may be useful in deciding when to attempt to engage in on-chip repair by enabling substitute circuits.

We turn now to the Period Generator 49 and its associated Timing SRAM 51. These respond to an eight bit signal T_SEL 43 that, for each two hundred and eight bit instruction fetched by the Micro-Controller Sequencer 19, determines a duration for the associated operation of the Timing/ Formatting & Comparison circuit 52. T_SEL 43 is member of the Various Control Values & Instructions 42 that are represented by the different fields within the fetched instruction. As an eight bit value it can represent or encode two hundred and fifty-six different things. In this case those "things" are twenty-eight bit values stored in the Timing SRAM 51 and that are addressed by T_SEL. Each addressed twenty-eight bit value (23) specifies a desired duration with a 19.5 picosecond resolution. The sequence of accessed twenty-eight bit duration values (23) is stored in a Period FIFO 50 so that the individual members of that sequence will be retrieved and applied in synchronism with the retrieval of their intended corresponding vector, which is stored in the Vector FIFO 45.

A coarse timing value field in the oldest entry in the FIFO 50 conveys duration information with a resolution of 5 nsec, and produces therefrom a signal VEC_FIFO_UNLOAD 47 that transfers the next transmit vector from the Vector FIFO 45 to the Timing/Formatting & Comparison circuit 52. A companion signal TIMING REMAINDER 48 is also applied to circuit 52. It is there that the ultimate resolution to 19.5 picoseconds is accomplished.

Figures 3, 4:
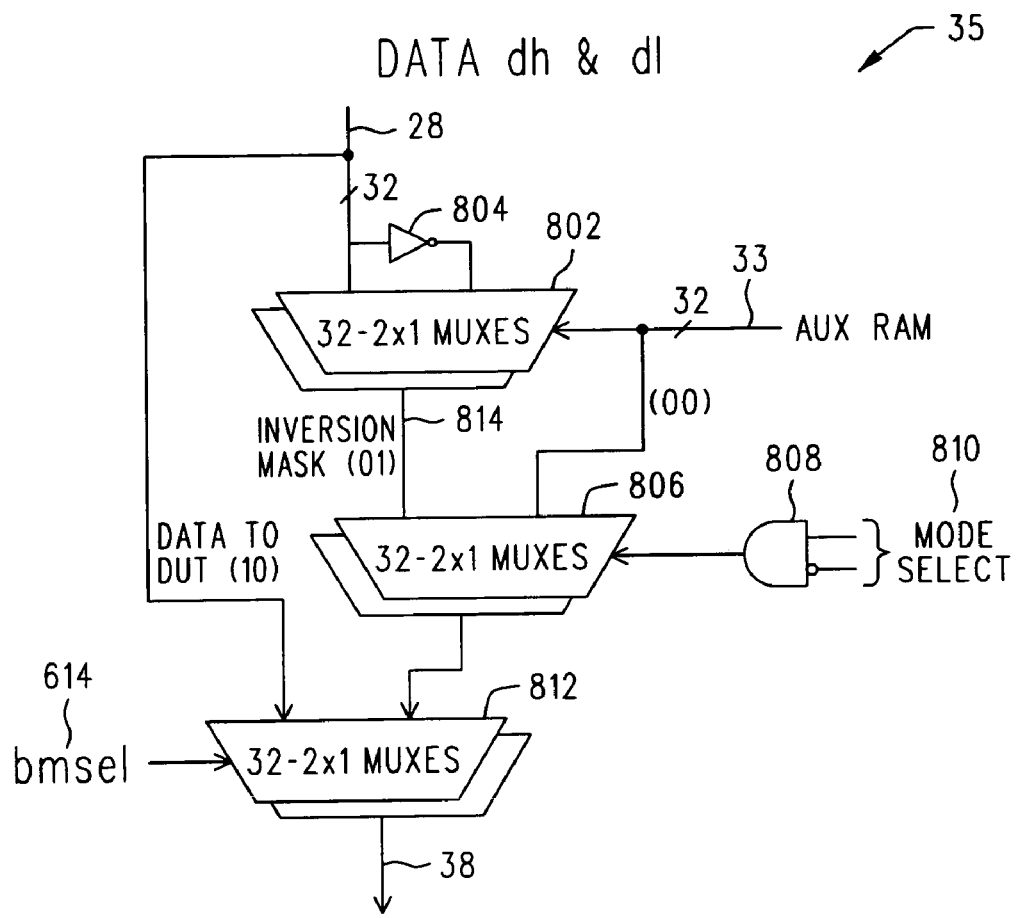
FIG. 3 is a block diagram of the data multiplexer 35 shown in FIG. 2.
FIG. 4 is a table shown for purposes of illustrative example of an inversion mask feature according to the teachings of the present invention.

With specific reference to FIG. 3 of the drawings, there is shown a block diagram of the components of the data multiplexer 35 in which the data patterns 28 from dl and dh ALU registers 24 provide 32-bits of data to a first data multiplexer 802. The first data multiplexer 802 comprises thirty-two(32) independently selectable 2×1 multiplexers. Each of the 32-bits of data patterns 28 pass through thirty-two(32) inverters 804 to provide an inverted second input for each of the 32-bits of data for respective ones of the 2×1 multiplexers in the first data multiplexer 802. A thirty-two (32) bit wide output from the auxiliary RAM 31 is used to select each one of the 32-bits or their inverse in the first data multiplexer 802. The thirty-two(32) bit output of the first data multiplexer 802 is fed into a second data multiplexer 806. Also fed into the second data multiplexer 806 is the output from the auxiliary RAM 31. The second data multiplexer 806 comprises a thirty-two(32) channel 2×1 multiplexer. A configuration register (not shown) that is typically programmed prior to test pattern execution has two bits dedicated to it for an auxiliary memory mode select 810. A mode select AND gate 808 accepts the auxiliary memory mode select bits 810 to generate a signal that selects either the output of the first data multiplexer 802 or the auxiliary RAM 31 to be presented as the output of the second data multiplexer 806. A third data multiplexer 812 accepts the thirty-two(32) bit output of the second data multiplexer 806 and the two(2) 16-bit dh and dl registers from the ALUs 24. The third data multiplexer 812 is a thirty-two(32) channel 2×1 multiplexer. A bmsel bit 614 selects either the thirty-two(32) bits of dh and dl register outputs from the ALUs 24 or the output of the second data multiplexer 806 for presentation as the output of the third data multiplexer 812. The bmsel bit 614 is one of the 208 bits that make up the instruction word originating in the program SRAM 20.

The auxiliary memory 31 (shown in FIG. 2 of the drawings) may be used in a way to supply inversion information for data comparison. The inversion information is stored in a mask format in the auxiliary memory wherein one mask bit corresponds to one cell in a block of memory that is tested. A one value for the mask bit indicates that the cell that is read from the memory is inverted from the value that is expected and a zero value for the mask bit indicates that no inversion is expected. In this mode, the auxiliary memory 31 is programmed with an inversion mask. With specific reference to FIG. 4 of the drawings, there is shown an example of an inversion mask for a hypothetical memory having 32 locations of 32-bit words. In the example, a first eight locations 902 of the DUT memory are not inverted. A second eight locations 904 of the DUT memory are inverted in bit positions 0–7 and 24–31. A third eight locations 906 of the DUT memory are inverted in bit positions 8–23. A fourth eight locations 908 are all inverted. Accordingly, the auxiliary memory 31 is programmed with the inversion mask shown in FIG. 4. In the inversion mask mode, the mode select 810 is programmed so the output of the first data multiplexer 802 is selected for presentation as a masked output 814 at the output of the second and third data multiplexers 806, 812. When the auxiliary memory 32 is accessed, the stored data 33 is used to select either the non-inverted bit from the dh and dl registers in the ALUs 24 or the inverted bit. In the example, for the first eight DUT memory locations, only the non-inverted bits are selected as the output of the first data multiplexer 802 because the inversion mask of all zeros selects the non-inverted inputs. The mode select bits 810 select the first set thirty-two(32) bits input into the second data multiplexer 806 from the first data multiplexer 802. The bmsel bit 614 is set to select the auxiliary memory path as the output of the third data multiplexer 812. For the second eight DUT memory locations, the inversion mask as input into the first data multiplexer 802 causes the inverted dh and dl register bits to be selected for the 0–7 and 24–31 bit positions. The mode select 810 and bmsel bit 614 remain the same as previously described in order to present the output of the first data multiplexer 802 at the output of the third data multiplexer 812. For the third eight DUT memory locations, the inversion mask as input into the first data multiplexer 802 causes the inverted dh and dl register bits to be selected for the 8–23 bit positions. The mode select 810 and the bmsel bit 614 are set to values to present the output of the first data multiplexer 802 at the output of the third data multiplexer 812. For the fourth eight DUT memory locations, the inversion mask as input into the first data multiplexer 802 causes the inverted dh and dl register bits to be selected for all of the bit positions. The mode select 810 and the bmsel bit 614 are set to values to present the output of the first data multiplexer 802 at the output of the third data multiplexer 812. Each program instruction cycle uses one of the thirty-two (32) bit masked output words from the data multiplexer 35, as a transmit or receive vector for the data channels. Advantageously, the test developer is able to program the inversion properties of the DUT memory into the auxiliary memory 31 and then disregard the inversion properties while developing the algorithmic test pattern. The inversion mask mode takes care of the task of administering the inversion properties which is independent of and used in conjunction with the algorithmic test pattern rendering development and debug of the test simpler and more efficient even with complicated and lengthy inversion properties.

The present disclosure discusses features of the present invention, which are described by way of example. One of ordinary skill in the art appreciates that the present invention may be scaled without departing from the scope of the claims. The present disclosure is intended to be illustrative and not limitative of the present invention, the scope of the invention being defined solely by the appended claims.

What is claimed is:

1. A method for administering inversion properties on data channels in a DUT tester comprising the steps of:
   storing an inversion mask in a memory,
   selectively inverting data information according to said inversion mask to generate a masked output,
   applying said masked output to said data channels.

2. A method for administering inversion properties on data channels in a DUT tester as recited in claim 1, the step of applying comprising the step of driving said data channels with values in said masked output.

3. A method for administering inversion properties on data channels in a DUT tester as recited in claim 1, said step of applying comprising the step of comparing data information received from said data channels with values in said masked output.

4. A method for administering inversion properties on data channels in a DUT tester as recited in claim 1, said step of inverting data information comprising the steps of providing parallel bits of data information and respective bits of inverted data information to a selector, and independently selecting either said data information bit or said inverted data information bit according to said inversion mask.

5. An apparatus for administering inversion properties on data channels in a DUT tester comprising:
   a memory storing an inversion mask,
   one or more data registers providing parallel bits of data information,
   a selector for each of said bits, said selector selecting said bit or an inversion of said bit according to said inversion mask, to generate parallel bits of masked information, and
   a vector processor for utilizing said masked information in said tester.

6. An apparatus for administering inversion properties on data channels in a DUT tester as recited in claim 5, said vector processor comprising a transmitter for transmitting said masked information to said data channels.

7. An apparatus for administering inversion properties on data channels in a DUT tester as recited in claim 5, said vector processor comprising a comparator for comparing said masked information to said data channels.

8. An apparatus for administering inversion properties on data channels in a DUT tester as recited in claim 5 wherein said selector comprises a multiplexer receiving said parallel bits, a plurality of inverters, one of said inverters for each one of said parallel bits, said multiplexer also receiving an output of all of said inverters, and said inversion mask comprising a select control for said selector.

9. A method for administering inversion properties on data channels in a memory tester comprising the steps of:
storing an inversion mask in a memory,
generating data channel values,
applying inversion properties to said data channel values according to said inversion mask to generate inversion processed data channels,
using said inversion processed data channels for testing a DUT.

10. A method for administering inversion properties as recited in claim 9, said step of applying said inversion properties further comprising the steps of inverting each data channel to generate inverted data channel values and inputting said data channel values and said inverted data channel values into a selector, using said inversion mask to independently select either said data channel value or said inverted data channel value to generate said inversion processed data channels.

11. An apparatus for administering inversion properties on data channels in a memory tester comprising a memory having a width equal to a number of the data channels, an inversion mask stored in said memory indicating whether a value on said data channels is inverted or not inverted, a selector that receives said inversion mask and generates values according to said data channels and said inversion mask to create inversion processed data channels, and a vector processor for utilizing said inversion processed data channels.

12. An apparatus for administering inversion properties on data channels as recited in claim 11 wherein said selector comprises a plurality of two to one multiplexers that select between a data channel value or an inverted data channel value.

13. An apparatus for administering inversion properties on data channels as recited in claim 12 and further comprising a plurality of inverters that accept each data channel value and generates said inverted data channel value.

14. An apparatus for administering inversion properties on data channels as recited in claim 13 wherein said select control for said multiplexers comprises an output of said memory.

* * * * *